(12) United States Patent
Bhuiyan et al.

(10) Patent No.: US 8,624,652 B1
(45) Date of Patent: Jan. 7, 2014

(54) ACCURATE LOW-POWER DELAY CIRCUIT

(75) Inventors: Ekram H. Bhuiyan, San Jose, CA (US);
Steve X. Chi, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/551,835

(22) Filed: Jul. 18, 2012

Related U.S. Application Data

(60) Provisional application No. 61/667,266, filed on Jul. 2, 2012.

(51) Int. Cl.
  *H03H 11/26* (2006.01)
(52) U.S. Cl.
  USPC ............... 327/261; 327/263; 327/268

(58) Field of Classification Search
  USPC ........................................ 327/261, 263, 268
  See application file for complete search history.

(56) References Cited

U.S. PATENT DOCUMENTS

| | | | |
|---|---|---|---|
| 5,955,907 A | 9/1999 | Niijima | |
| 6,310,503 B1 | 10/2001 | Kim et al. | |
| 6,845,049 B2 | 1/2005 | Lim et al. | |
| 7,400,177 B2 | 7/2008 | Kim et al. | |
| 7,759,975 B2 | 7/2010 | Murabayashi et al. | |
| 7,772,908 B2 | 8/2010 | Sinha et al. | |
| 7,932,764 B2 * | 4/2011 | Chou | 327/268 |
| 2011/0157978 A1 | 6/2011 | Shinozaki et al. | |

* cited by examiner

*Primary Examiner* — John Poos
(74) *Attorney, Agent, or Firm* — Weaver Austin Villeneuve & Sampson LLP

(57) ABSTRACT

Delay circuits are described for which the delay remains substantially constant within a desired range of variation of supply voltage and/or temperature.

15 Claims, 4 Drawing Sheets

ACCURATE LOW-POWER DELAY CIRCUIT

RELATED APPLICATION DATA

The present application claims priority under 35 U.S.C. 119(e) to U.S. Provisional Patent Application No. 61/667,266 filed Jul. 2, 2012, the entire disclosure of which is incorporated herein by reference for all purposes.

BACKGROUND OF THE INVENTION

The present invention relates to delay circuits and, in particular, to delay circuits for which the delay remains substantially constant within a desired range of variation of supply voltage and/or temperature.

Delay circuits are an important part of both analog and digital systems. A common approach to implementing a delay circuit involves delaying an input signal using a reference current (or resistor) and capacitor, and comparing the resulting signal to a reference voltage using a comparator to generate the delayed version of the input. Assuming the use of components that are stable over voltage and temperature, such an approach can be used to provide very accurate and stable delay circuits. However, the use of a comparator and the associated reference voltage circuit consumes considerable die area and requires some amount of quiescent current.

SUMMARY OF THE INVENTION

According to the present invention, a delay circuit is provided. According to a particular implementation, a delay circuit includes first delay circuitry configured to receive an input signal and generate an intermediate signal. The first delay circuitry includes a first capacitor, first charging circuitry configured to charge and discharge the first capacitor in response to the input signal, and a first gate circuit having a first threshold voltage. The first delay circuitry contributes a first delay component of a total delay through the delay circuit. Second delay circuitry is configured to receive the intermediate signal and generate an output signal. The second delay circuitry includes a second capacitor, second charging circuitry configured to charge and discharge the second capacitor in response to the intermediate signal, and a second gate circuit having a second threshold voltage. The second delay circuitry contributes a second delay component of the total delay. The first and second threshold voltages of the first and second gate circuits change in response to a temperature change or a supply voltage change such that a resulting change in the first delay component of the total delay is substantially offset by a resulting change in the second delay component of the total delay such that the total delay remains substantially constant.

According to another implementation, a delay circuit includes first delay circuitry configured to receive an input signal and generate an intermediate signal. The first delay circuitry contributes a first delay component of a total delay through the delay circuit. Second delay circuitry is configured to receive the intermediate signal and generate an output signal. The second delay circuitry contributes a second delay component of the total delay. A first operational parameter of the first delay circuitry and a second operational parameter of the second delay circuitry change in response to a temperature change or a supply voltage change such that a resulting change in the first delay component of the total delay is substantially offset by a resulting change in the second delay component of the total delay such that the total delay remains substantially constant.

According to another implementation, a method of operating a delay circuit is provided. The delay circuit includes first delay circuitry configured to receive an input signal and generate an intermediate signal. The first delay circuitry also includes a first gate circuit having a first threshold voltage, and a first capacitor coupled between an input of the first gate circuit and a supply voltage of the delay circuit. The delay circuit further includes second delay circuitry configured to receive the intermediate signal and generate an output signal. The second delay circuitry includes a second gate circuit having a second threshold voltage, and a second capacitor coupled between an input of the second gate circuit and a reference of the delay circuit. The first capacitor is charged and discharged in response to transitions of the input signal. The first delay circuitry contributes a first delay component of a total delay through the delay circuit. The second capacitor is charged and discharged in response to transitions of the intermediate signal corresponding to the transitions of the input signal. The second delay circuitry contributes a second delay component of the total delay. The first and second threshold voltages of the first and second gate circuits change in response to a temperature change or a supply voltage change such that a resulting change in the first delay component of the total delay is substantially offset by a resulting change in the second delay component of the total delay such that the total delay remains substantially constant.

A further understanding of the nature and advantages of the present invention may be realized by reference to the remaining portions of the specification and the drawings.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Figure 1:
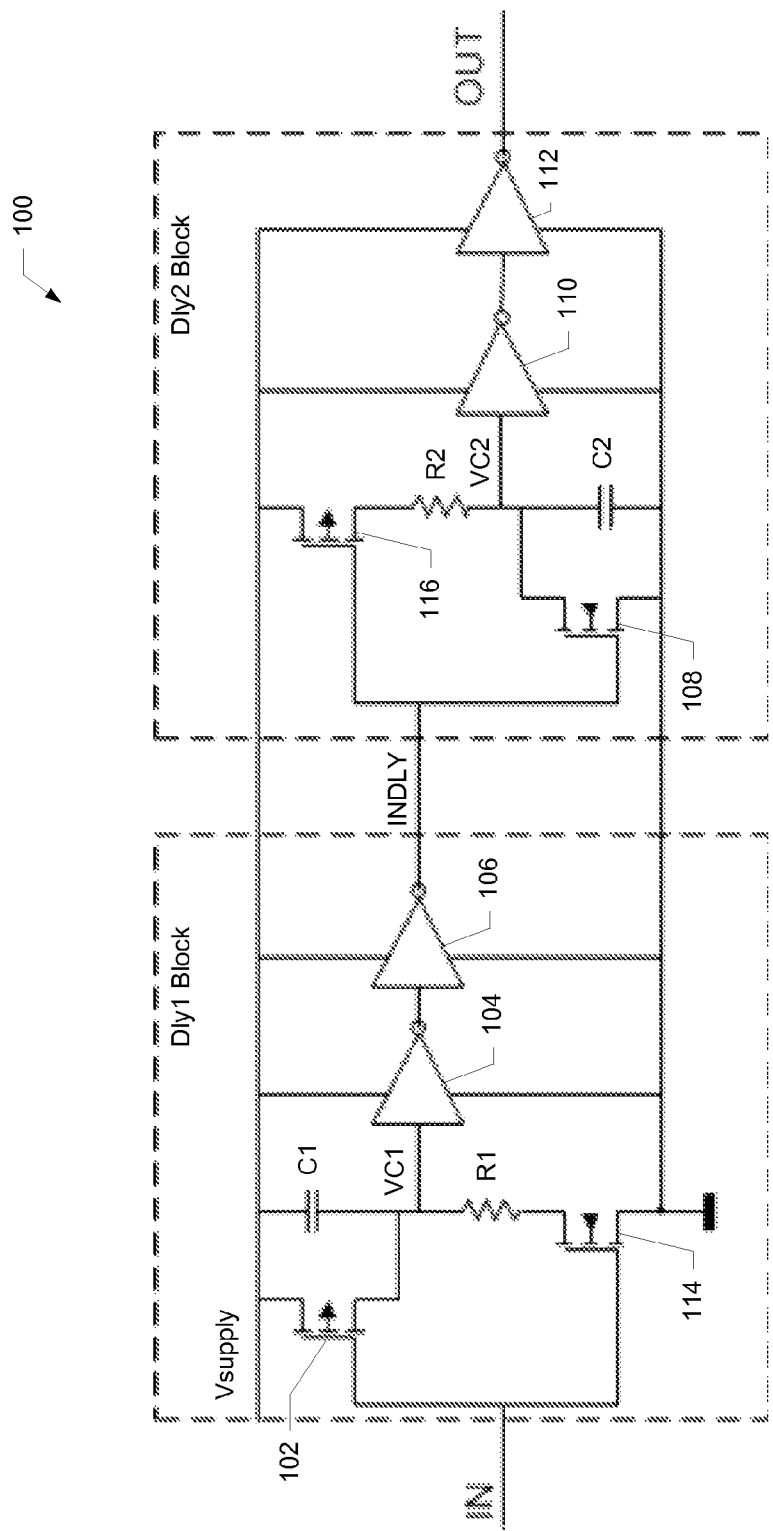
FIG. 1 is a simplified schematic diagram of a specific implementation of a delay circuit.

FIG. 1 is a schematic diagram of a specific implementation of a delay circuit 100 that includes a first delay circuit referred to as "Dly1 Block" that generates a first component of a total delay, and a second delay circuit referred to as "Dly2 Block" that generates a second component of the total delay. As can be seen, the depicted delay circuit does not employ a comparator or reference voltage and therefore does not require quiescent current. And as will be discussed, an accurate and stable (e.g., over voltage and temperature) delay may be achieved with delay circuit 100 without the area penalty associated with conventional delay circuits.

Figure 2:
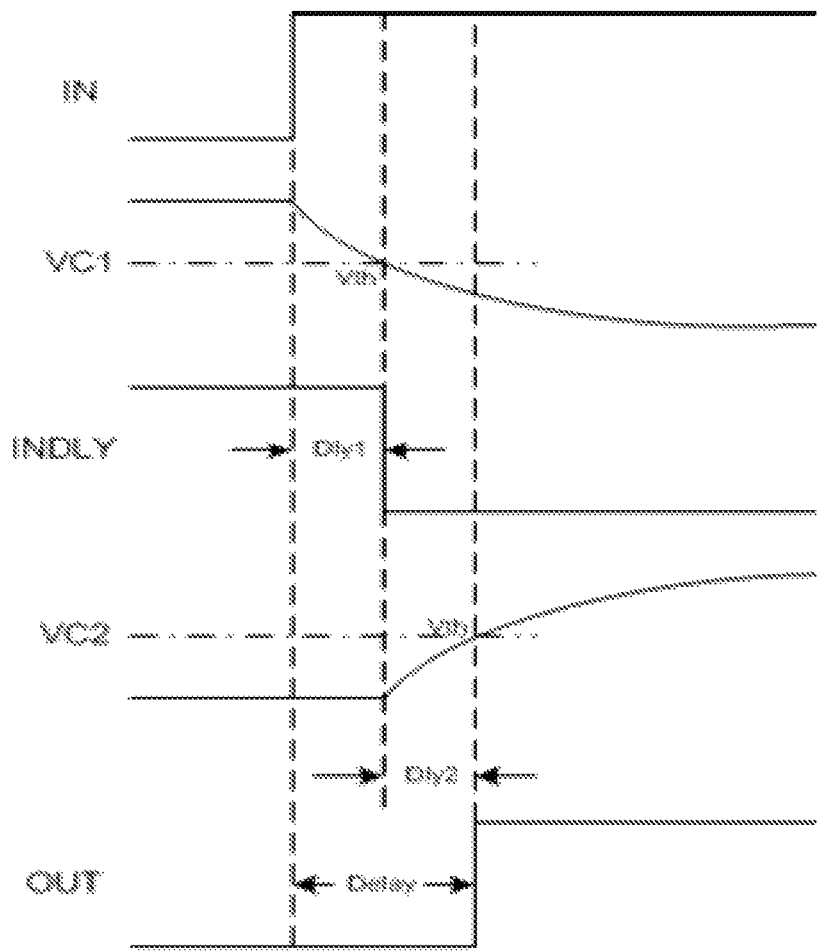
FIG. 2 shows waveforms illustrating operation of a specific implementation of a delay circuit.

The operation of delay circuit 100 may be understood with reference to the waveforms of FIG. 2. When the input voltage IN is low (e.g., 0 volts), pmos device 102 is on and pulls the input of inverter 104 up to near Vsupply (e.g., 5 volts), i.e., voltage VC1 is high. The voltage INDLY tracks VC1 through inverters 104 and 106 and is therefore also high. And because INDLY is high, nmos device 108 is on and pulls the voltage VC2 at input of inverter 110 down toward the circuit's reference voltage, e.g., ground. The output voltage OUT (through the double inversion of inverters 110 and 112) is therefore also low.

When input voltage IN goes high, pmos device 102 turns off and nmos device 114 turns on, charging capacitor C1 through resistor R1. As a result, the voltage VC1 falls close to ground according to a time constant based largely on R1 and C1 as shown in FIG. 2. When the voltage at VC1 crosses the threshold voltage Vth of inverter 104, both inverters 104 and 106 switch, resulting in the voltage at INDLY going low.

When INDLY goes low, nmos device 108 turns off and pmos device 116 turns on, charging capacitor C2 through resistor R2. As a result, the voltage VC2 rises close to Vsupply according to a time constant based largely on R2 and C2. When VC2 crosses Vth of inverter 110, both inverters 110 and 112 switch, resulting in the output voltage OUT going high.

The time difference between the rising edge of the input voltage IN and the rising edge of the output voltage OUT is the total delay ("Delay") through delay circuit 100. As can be seen in FIG. 2, this total delay has two components, one denoted "Dly1" contributed by the "Dly1 Block" and one denoted "Dly2" contributed by the "Dly2 Block." The relevance of these two delay components to the stability of the total delay through delay circuit 100 will become apparent with reference to the following description.

The degree to which the values of R1, C1, R2, and C2 are stable (e.g., over voltage and temperature) will determine the consistency and stability of the voltages VC1 and VC2, and is at least partially determinative of the stability of the total delay through delay circuit 100. Thus, the precision and stability of these components may be selected to support a desired level of stability for the total delay for a given application. According to various embodiments, the values of these components are selected such that the time constants R1*C1 and R2*C2 are substantially the same (taking into account the tolerance of the components used).

On the other hand, the voltages at which inverters 104 and 110 switch, i.e., Vth, may vary over temperature in a way that can significantly affect the delay components of each block. However, if the operational parameters of inverters 104 and 110 are sufficiently matched (sufficient for a desired level of stability), the effect of the variations in Vth on the total delay may be substantially reduced. That is, the total delay may be held substantially constant (within the desired range) even though the delay components Dly1 and Dly2 vary. How this is accomplished may be understood with reference to FIG. 3.

Figure 3:
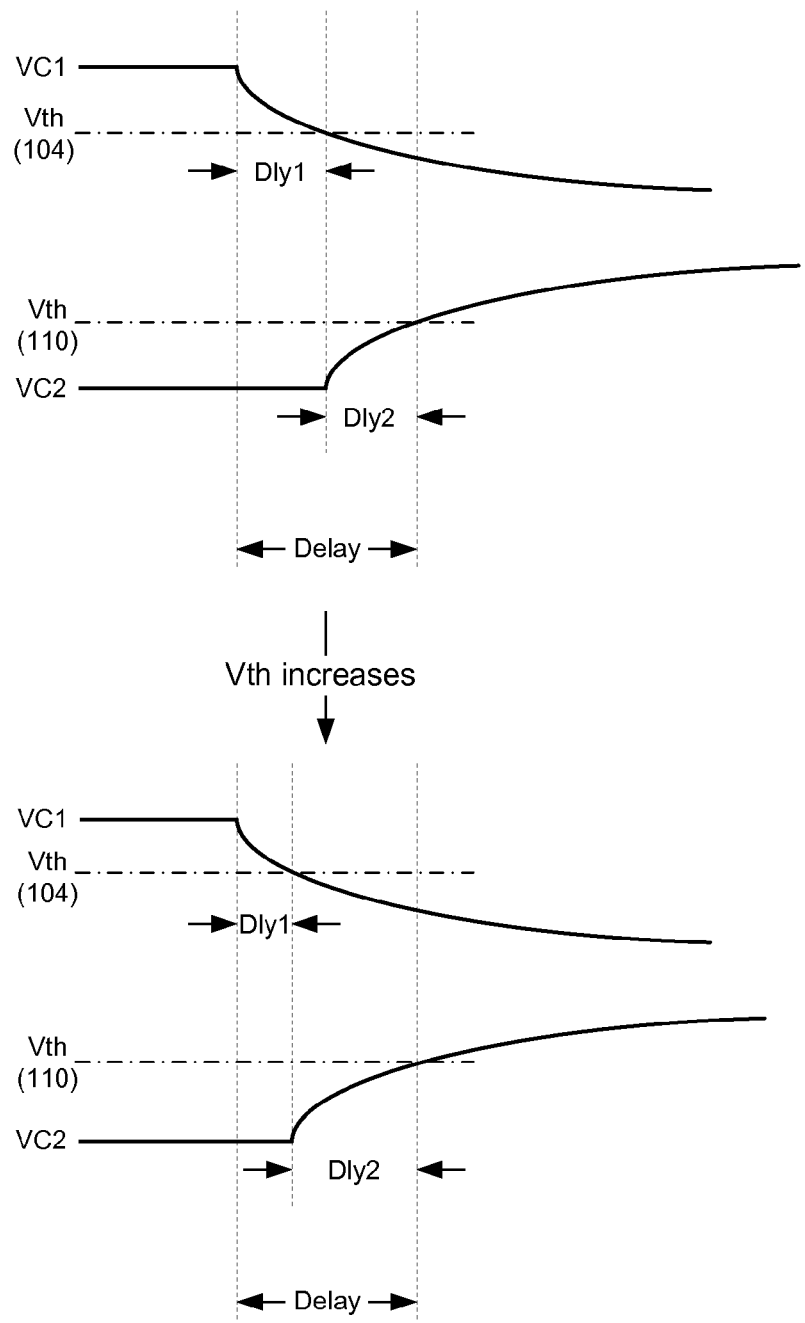
FIG. 3 shows waveforms illustrating operation of a specific implementation of a delay circuit.

FIG. 3 shows the waveforms for VC1 and VC2 for two different conditions. The top set of waveforms largely corresponds to the condition represented by the waveforms of FIG. 2. The bottom set of waveforms illustrates the condition in which the respective threshold voltages, Vth, of inverters 104 and 110 have increased, e.g., due to a change in temperature. Because the inverters have been selected or fabricated to ensure that their operational parameters are matched to a desired level of precision, their respective threshold voltages respond substantially similarly to whatever stimulus or environmental condition causes the change. For example, Vth will change substantially the same amount for both inverters in response to a temperature change experienced by both. Again, some variation between the two may be acceptable depending on the level of stability desired.

As can be seen in FIG. 3, the effect of the increase in the Vth of inverter 104 is that inverter 104 switches sooner than in the upper set of waveforms, and the delay component Dly1 is correspondingly reduced. On the other hand, the effect of the increase in the Vth of inverter 110 is that inverter 110 switches later, and the delay component Dly2 is correspondingly increased. However, because the change in Vth for each inverter is similar, the reduction in delay component Dly1 is substantially offset by the increase in delay component Dly2, resulting in the total delay being held substantially constant (within the desired range). Thus, delay circuits designed as described herein may have a substantially constant delay over a significant temperature range.

It should be noted that the curves of VC1 and VC2 for the depicted implementation are not straight lines and that therefore there may be some variation between the size of the decrease of one delay component as compared to the size of the offsetting increase of the other delay component even where the change in Vth is identical. It should also be noted that the drawings are not necessarily to scale and that for a given range of variation in Vth and a given acceptable range of stability in the total delay, the approximation of these curves as straight lines is a good one for most cases.

As discussed above, the total delay through the delay circuit is dependent on the values of R1, C1, R2, and C2, and therefore the contribution of these components to the variability of the total delay may be controlled to a desired degree of precision by careful selection and/or manufacture of these components. However, the delay components Dly1 and Dly2 are also dependent on the supply voltage (Vsupply). But because the threshold voltage (Vth) of an inverter changes proportionally with its supply voltage, any increase in Vsupply will have a similar effect on the threshold voltages of inverters 104 and 110. As discussed above, because inverters 104 and 110 are sufficiently well matched, the change in the Vth of the respective inverters is substantially the same (within the desired range of similarity), the changes in delay components Dly1 and Dly2 should substantially offset and the total delay remain substantially constant. Thus, delay circuits designed as described herein may also be substantially immune to changes in supply voltage.

Figure 4:
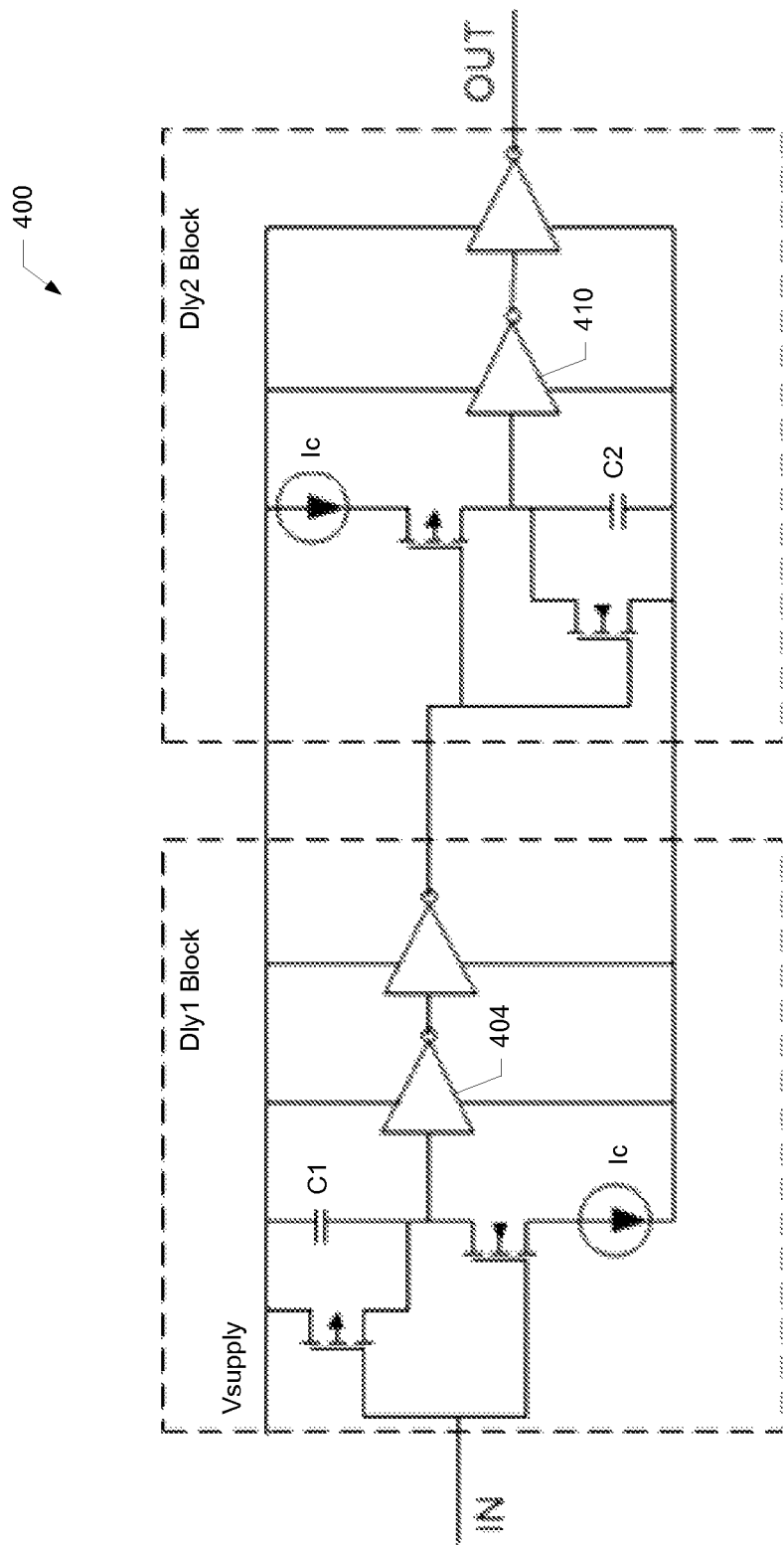
FIG. 4 is a simplified schematic diagram of a specific implementation of a delay circuit.

An alternative implementation of a delay circuit is illustrated in FIG. 4. As can be seen, the operation of delay circuit 400 is similar to that of delay circuit 100 of FIG. 1 with the primary difference relating to the use of current sources Ic (where Ic is proportional to Vsupply) to charge the capacitors in each block. Again, because inverters 404 and 410 are sufficiently well matched, changes in their respective threshold voltages will track over voltage and temperature, resulting in the desired level of stability for the total delay through delay circuit 400.

Various implementations of delay circuits as described herein may be characterized by one or more advantages. For example, because comparators and reference voltages are not required, a significant reduction in the silicon area required to implement a delay circuit may be realized. In another example, because no voltage reference is required, placement of the delay circuit is not constrained by the necessity to connect with a reference. This is particular useful in the digital design domain. So, it should be understood that various implementations may be equally suitable for use in analog or digital systems. In another example, delay circuits may be implemented entirely with components which do not require quiescent current, therefore reducing overall system power dissipation.

While the invention has been particularly shown and described with reference to specific embodiments thereof, it will be understood by those skilled in the art that changes in the form and details of the disclosed embodiments may be made without departing from the spirit or scope of the invention. For example, various implementations are contemplated as being implemented using any of a variety of standard or proprietary CMOS processes. However, it should be noted that implementations are contemplated that may employ a much wider range of semiconductor materials and manufacturing processes including, for example, GaAs, SiGe, etc. Delay circuits as described herein may be represented (without limitation) in software (object code or machine code in non-transitory computer-readable media), in varying stages of compilation, as one or more netlists (e.g., a SPICE netlist), in a simulation language, in a hardware description language (e.g., Verilog, VHDL), by a set of semiconductor processing masks, and as partially or completely realized semiconductor devices (e.g., an ASIC). The various alternatives for each of the foregoing as understood by those of skill in the art are also within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A delay circuit, comprising:
   first delay circuitry configured to receive an input signal and generate an intermediate signal, the first delay circuitry including a first capacitor, first charging circuitry configured to charge and discharge the first capacitor in response to the input signal, and a first gate circuit having a first threshold voltage, the first delay circuitry contributing a first delay component of a total delay through the delay circuit; and
   second delay circuitry configured to receive the intermediate signal and generate an output signal, the second delay circuitry including a second capacitor, second charging circuitry configured to charge and discharge the second capacitor in response to the intermediate signal, and a second gate circuit having a second threshold voltage, the second delay circuitry contributing a second delay component of the total delay;
   wherein the first and second threshold voltages of the first and second gate circuits change in response to a temperature change or a supply voltage change such that a resulting change in the first delay component of the total delay is substantially offset by a resulting change in the second delay component of the total delay such that the total delay remains substantially constant.

2. The delay circuit of claim 1, wherein the first charging circuitry comprises one or more first switches responsive to the input signal and a first resistor in series with the first capacitor, and wherein the second charging circuitry comprises one or more second switches responsive to the intermediate signal and a second resistor in series with the second capacitor.

3. The delay circuit of claim 1, wherein the first charging circuitry comprises one or more first switches responsive to the input signal and a first current source in series with the first capacitor, and wherein the second charging circuitry comprises one or more second switches responsive to the intermediate signal and a second current source in series with the second capacitor.

4. The delay circuit of claim 1, wherein the first and second gate circuits comprise first and second inverters respectively.

5. The delay circuit of claim 1, wherein the first and second delay circuitry do not require quiescent current.

6. The delay circuit of claim 1, wherein the first capacitor is coupled between the supply voltage and an input to the first gate circuit, and the second capacitor is coupled between a reference of the delay circuit and an input of the second gate circuit, and wherein the first charging circuitry is configured to charge the first capacitor in response to a positive going transition of the input signal, and the second charging circuitry is configured to charge the second capacitor in response to the positive going transition of the input signal.

7. The delay circuit of claim 1, wherein the first and second threshold voltages change proportionally with the supply voltage.

8. A digital system comprising one or more instances of the delay circuit of claim 1.

9. An analog system comprising one or more instances of the delay circuit of claim 1.

10. A delay circuit, comprising:
    first delay circuitry configured to receive an input signal and generate an intermediate signal, the first delay circuitry contributing a first delay component of a total delay through the delay circuit; and
    second delay circuitry configured to receive the intermediate signal and generate an output signal, the second delay circuitry contributing a second delay component of the total delay;
    wherein a first operational parameter of the first delay circuitry and a second operational parameter of the second delay circuitry change in response to a temperature change or a supply voltage change such that a resulting change in the first delay component of the total delay is substantially offset by a resulting change in the second delay component of the total delay such that the total delay remains substantially constant.

11. The delay circuit of claim 10, wherein the first delay circuitry includes a first inverter, and the second delay circuitry comprises a second inverter, and wherein the first operational parameter of the first delay circuitry comprises a first threshold voltage of the first inverter, and the second operational parameter of the second delay circuitry comprises a second threshold voltage of the second inverter.

12. The delay circuit of claim 10, wherein the first delay circuitry includes a first capacitor, first charging circuitry configured to charge and discharge the first capacitor in response to the input signal via a first resistor or a first current source, and a first inverter, and wherein the second delay circuitry includes a second capacitor, second charging circuitry configured to charge and discharge the second capacitor in response to the input signal via a second resistor or a second current source, and a second inverter, and wherein the first operational parameter of the first delay circuitry comprises a first threshold voltage of the first inverter, and the second operational parameter of the second delay circuitry comprises a second threshold voltage of the second inverter.

13. The delay circuit of claim 12, wherein the first capacitor is coupled between the supply voltage and an input to the first inverter, and the second capacitor is coupled between a reference of the delay circuit and an input of the second inverter, and wherein the first charging circuitry is configured to charge the first capacitor in response to a positive going transition of the input signal, and the second charging circuitry is configured to charge the second capacitor in response to the positive going transition of the input signal.

14. The delay circuit of claim 12, wherein the first and second threshold voltages change proportionally with the supply voltage.

15. A method of operating a delay circuit, the delay circuit including first delay circuitry configured to receive an input signal and generate an intermediate signal, the first delay circuitry including a first gate circuit having a first threshold voltage, and a first capacitor coupled between an input of the first gate circuit and a supply voltage of the delay circuit, the delay circuit further including second delay circuitry configured to receive the intermediate signal and generate an output signal, the second delay circuitry including a second gate circuit having a second threshold voltage, and a second capacitor coupled between an input of the second gate circuit and a reference of the delay circuit, the method comprising:

charging and discharging the first capacitor in response to transitions of the input signal, the first delay circuitry contributing a first delay component of a total delay through the delay circuit; and charging and discharging the second capacitor in response to transitions of the intermediate signal corresponding to the transitions of the input signal, the second delay circuitry contributing a second delay component of the total delay;

wherein the first and second threshold voltages of the first and second gate circuits change in response to a temperature change or a supply voltage change such that a resulting change in the first delay component of the total delay is substantially offset by a resulting change in the second delay component of the total delay such that the total delay remains substantially constant.

* * * * *